US012573954B2

(12) United States Patent
Philbrick et al.

(10) Patent No.: US 12,573,954 B2
(45) Date of Patent: Mar. 10, 2026

(54) DUAL MODE CURRENT SENSING IN HIGH POWER DRIVER AND SWITCH TRANSISTOR MODULE

(71) Applicant: Alpha and Omega Semiconductor International LP, Toronto (CA)

(72) Inventors: Rhys Philbrick, Los Gatos, CA (US); Zhiye Zhang, San Jose, CA (US)

(73) Assignee: Alpha and Omega Semiconductor International LP, Toronto (CA)

( * ) Notice: Subject to any disclaimer, the term of this patent is extended or adjusted under 35 U.S.C. 154(b) by 172 days.

(21) Appl. No.: 18/454,575

(22) Filed: Aug. 23, 2023

(65) Prior Publication Data

US 2025/0070668 A1 Feb. 27, 2025

(51) Int. Cl.
*H02M 3/158* (2006.01)
*G01R 19/00* (2006.01)

(52) U.S. Cl.
CPC ........ *H02M 3/158* (2013.01); *G01R 19/0092* (2013.01)

(58) Field of Classification Search
CPC ......... H02M 3/33538; H02M 3/33546; H02M 3/33515; H02M 3/33576; H02M 3/33553; H02M 3/33507; H02M 3/33592; H02M 3/33523; H02M 3/3353; H02M 3/33569
See application file for complete search history.

(56) References Cited

U.S. PATENT DOCUMENTS

| | | | |
|---|---|---|---|
| 3,974,439 A | 8/1976 | Holland | |
| 7,659,673 B2 | 2/2010 | Lys | |
| 7,928,703 B2 * | 4/2011 | Tan .................. | H02M 7/53803 323/283 |
| 9,071,134 B2 | 6/2015 | Harriman et al. | |

(Continued)

FOREIGN PATENT DOCUMENTS

TW 202219684 A 5/2022

OTHER PUBLICATIONS

Taiwan Office Action in related foreign matter, dated Feb. 24, 2025.

(Continued)

*Primary Examiner* — Bryan R Perez

(74) *Attorney, Agent, or Firm* — Thompson Patent Law Offices PC

(57) ABSTRACT

Apparatus and associated methods relate to circuit load balancing in a multi-phase power supply system (MPPSS). In an illustrative example, a MPPSS may include multiple power phases, each driven by a corresponding power phase driver (e.g., a DRMOS). A controller, for example, may include multiple current balancing inputs, each corresponding to one of the power phases. For example, the current balancing inputs may be generated by a dual mode current sensing circuit (DMCSC). For example, in a data collection mode of a power phase, the DMCSC may store information of an output current. In a sensing mode of the power phase, the DMCSC may generate a current balancing input to the controller based on a direct current resistance of the current sensing circuit and an active resistance in the low side driver (Continued)

100
105

110 Power Supply

135 Multi-Phase Power Control Circuit (MPPC)

140 Power Phase Drivers
150

Sense FET Circuit

145 Driver Circuit
155 HS 160 LS

Iout

V_OUT

165 PWM Controller

170 Multiple Power Stages Current Sensing Circuit
V_OUT
180 DMCSC

175 Controller
195 Current Regulation Engine 190 Phase Compensation Engine 185 Noise Canceling Module
Ibal_n··· Ibal_1
Isenn

115 Load Domain
120 Processor
125 Memory
130 Peripheral circuit. Various embodiments may advantageously measure current imbalance in a cost effective manner.

16 Claims, 4 Drawing Sheets

(56)                    References Cited

U.S. PATENT DOCUMENTS

2005/0218838  A1      10/2005  Lys
2007/0296387  A1*     12/2007  Dong ................... H02M 3/157
                                                       323/285

OTHER PUBLICATIONS

Steele, J, Low Side RDS(on) Current Sensing, Planet Analog, Feb. 5, 2018, retrieved from the internet https://www.planetanalog.com/low-side-rdson-current-sensing/.

* cited by examiner

DUAL MODE CURRENT SENSING IN HIGH POWER DRIVER AND SWITCH TRANSISTOR MODULE

TECHNICAL FIELD

Various embodiments relate generally to load balancing systems and methods for high frequency power converter circuits.

BACKGROUND

Many direct current (DC)-DC power integrated circuits (IC) may include current sensing circuits. For example, a Metal Oxide Semiconductor Field Effect Transistor (MOS-FET) power converter system may utilize a current sensing circuit to accurately measure the output current for proper operation and protection against overcurrent conditions. Various current sensing techniques may be implemented. For example, the current sensing circuit may include shunt resistors, current transformers, Hall-effect sensors, and sensing circuits. Various implementations may have different advantages and limitations in terms of accuracy, cost, size, and complexity.

A driver and MOSFET (DRMOS) module may sometimes be referred to as a power management package that integrates a MOSFET and a driver IC into a single package. This technology has become increasingly popular in recent years due to its numerous advantages over traditional discrete solutions. DRMOS offers better efficiency, thermal performance, and reliability, which may be critical factors in power electronics applications. The integration of the MOS-FET and driver IC reduces parasitic inductances and capacitances, which can cause switching losses and electromagnetic interference (EMI) issues. Additionally, the single-package design simplifies the PCB layout and assembly process, reduces component count and size, and improves thermal management by allowing for better heat dissipation. DRMOS modules may be commonly used in high-performance desktop and server motherboards, graphics cards, and other power electronics applications that require high efficiency and reliability.

In some power converter applications (e.g., in DC power supply for processors), it may be advantageous to balance the current between phases to ensure even distribution of the load and prevent overheating and overloading of individual phases. For example, some current sensing techniques may be used to accurately measure the current in each phase. Some examples of such techniques include multi-phase current sensing circuits and/or interleaved power converter topologies.

SUMMARY

Apparatus and associated methods relate to circuit load balancing in a multi-phase power supply system (MPPSS). In an illustrative example, a MPPSS may include multiple power phases, each driven by a corresponding power phase driver (e.g., a DRMOS). A controller, for example, may include multiple current balancing inputs, each corresponding to one of the power phases. For example, the current balancing inputs may be generated by a dual mode current sensing circuit (DMCSC). For example, in a data collection mode of a power phase, the DMCSC may store information of an output current. In a sensing mode of the power phase, the DMCSC may generate a current balancing input to the controller based on a direct current resistance of the current sensing circuit and an active resistance in the low side driver circuit. Various embodiments may advantageously measure current imbalance in a cost-effective manner.

Various embodiments may achieve one or more advantages. For example, some embodiments may advantageously compensate for gain errors of the current balancing inputs digitally based on a sense compensation input. Some embodiments, for example, may advantageously measure the current balancing inputs relative to a power ground to advantageously avoid integration of a large ground plate. For example, some embodiments may advantageously balance phase current of more than twelve power phases. Some embodiments may, for example, advantageously include an overcurrent protection circuit such that a high side transistor, a low side transistor, a sense FET circuit, and the overcurrent protection circuit may be integrated in a single package. For example, some embodiments may advantageously include a package outline of 5 mm×5 mm. For example, some embodiments may advantageously control a difference between the load current of the at least two power phase drivers within a maximum of 5%. Some embodiments may, for example, advantageously regulate a total current output of the at least two phase power drivers to prevent an overcurrent of the MPPSS.

The details of various embodiments may be set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document may be organized as follows. First, to help introduce discussion of various embodiments, a multiple power phases current sensing circuit (MPSCSC) may be introduced with reference to FIG. 1. Second, that introduction leads into a description with reference to FIGS. 2-3 of some exemplary embodiments of a dual mode current sampling circuit (DMCSC) applicable in an exemplary MPSCSC. Third, with reference to FIG. 4, this document describes exemplary apparatus and methods useful for regulating and controlling power output of a total and each individual phase of the MPSCSC. Finally, the document discusses further embodiments, exemplary applications and aspects relating to MPSCSC.

Figure 1:
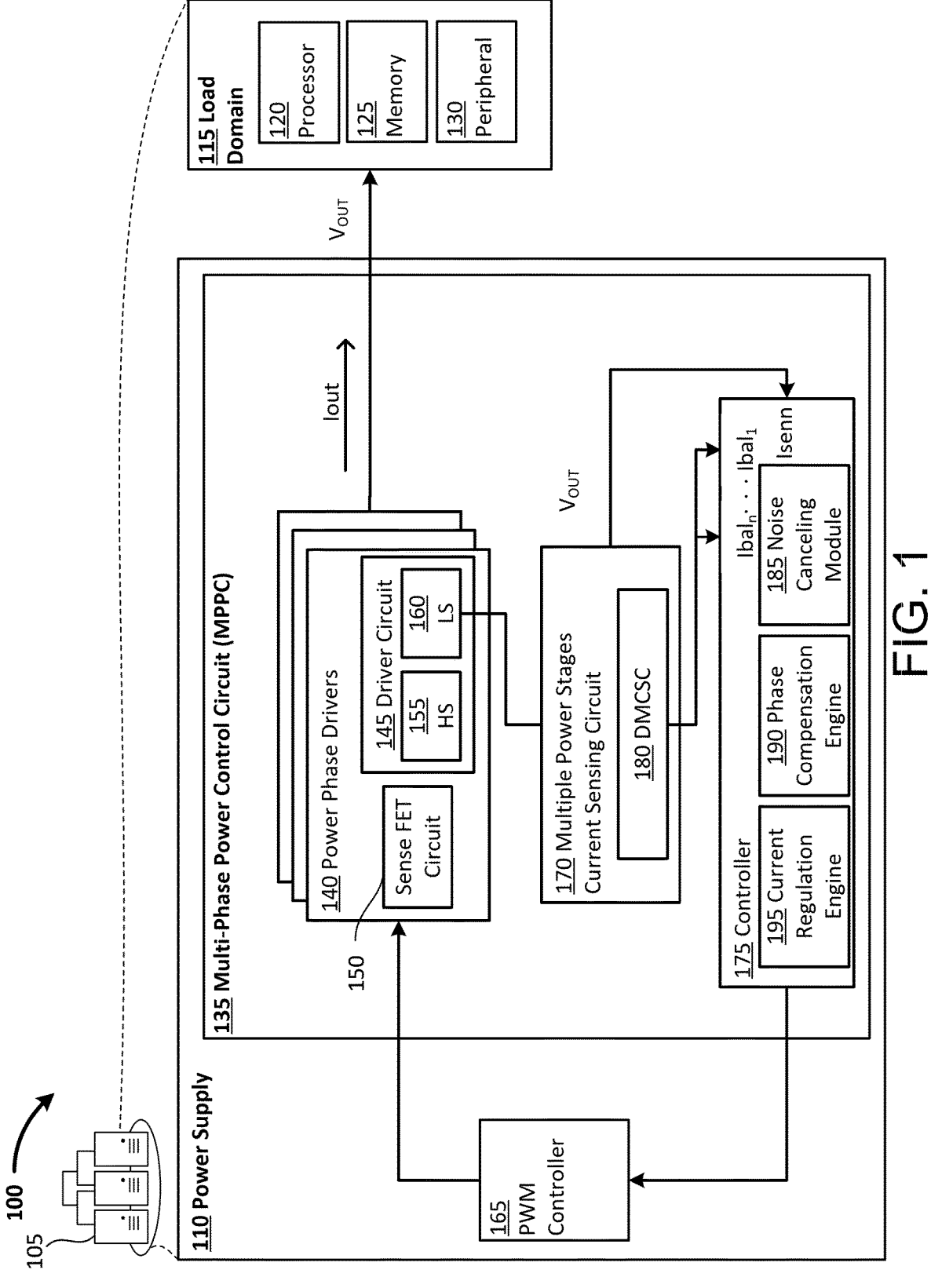
FIG. 1 depicts an exemplary multiple power stages current sensing circuit (MPSCSC) in an illustrative use-case scenario of a power supply circuit providing power to a load, in which the MPSCSC may be configured to measure balance current signals of each phase in the power supply circuit.

FIG. 1 depicts an exemplary multiple power phases current sensing circuit (MPSCSC) in an illustrative use-case scenario of a power supply circuit providing power to a load, in which the MPSCSC may be configured to measure balance current signals of each phase in the power supply circuit. In the depicted illustrative use-case scenario 100, servers 105 may be provided with power by a power supply circuit 110. For example, the servers 105 may be data centers. For example, the servers 105 may be a game system. The power supply circuit 110 provides power (e.g., via current out $I_{OUT}$) to a load domain 115 of the servers 105. The power supply circuit 110 may include, by way of example and not limitation, one or more switching power supplies. As depicted, the load domain 115 of the servers 105 includes, by way of example and not limitation, a processor 120 (e.g., a central processing unit (CPU), a graphics processing unit (GPU)), memory 125, other associated peripherals 130, or some combination thereof.

In this example, the load domain 115 receives power from a multi-phase power control circuit (MPPCC 135). For example, the MPPCC 135 may include a multi-phase buck regulator. For example, the MPPCC 135 may supply power in multiple power stages multiple interleaved buck converter stages in parallel to provide a regulated output voltage (e.g., Vout as labeled in FIG. 1). In some implementations, the MPPCC 135 may advantageously supply power with a reduced input and output ripple, and high efficiency. For example, the regulated power may be used to supply the load domain 115 with high power applications. For example, the load domain 115 may include data centers. For example, the load domain 115 may include high-end video graphic cards.

In some implementations, the MPPCC 135 may include a power management integrated circuit (PMIC) that includes overcurrent protection (OCP) and/or negative current protection (NCP). For example, the MPPCC 135 may advantageously prevent damage to the system and ensure safe operation by limiting the current flow to a safe level in case of a fault condition (e.g., short circuit, overload, overcurrent in the power supply circuit 110, phase imbalance in the power supply circuit 110). In various implementations, the MPPCC 135 may include a small package size. As an example, without limitation, the MPPCC 135 may be implemented with a 5 mm×5 mm package outline. For example, a MPPCC 135 with a small package size may be suitable for space-constrained applications (e.g., graphic cards, mobile devices, wearables, other portable electronics).

The MPPCC 135 includes multiple phases (2, 3, 4, 6, 12, 24, or more phases) of power phase drivers 140. In this example, each of the power phase drivers 140 includes a driver circuit 145 and a sense FET circuit 150. For example, each of the power phase drivers 140 may be a DRMOS. For example, each of the power phase drivers 140 may include a driver IC combined with an external switch transistor circuit. For example, the driver circuit 145 may include a driver inverter circuit (e.g., with a pair of power MOSFET). For example, the sense FET circuit 150 may include a pair of sense MOSFETs. In some implementations, the driver circuit 145 and the sense FET circuit 150 may be integrated in a single package. For example, a single packaged power stage may advantageously reduce the number of components and improve layout efficiency.

As shown, the driver circuit 145 includes a high side driver 155 and a low side driver 160. For example, the high side driver 155 and the low side driver 160 may be driven by a PWM controller 165. The sense FET circuit 150 may, for example, receive a phase control signal from a control circuit (not shown) of the corresponding power stage. In some implementations, the high side driver 155 may include a high-side field effect transistor (FET). In some implementations, the low side driver 160 may include a low-side FET.

In this example, the power phase drivers 140 receive the phase control signal from a pulse width modulation controller (PWM controller 165). For example, the PWM controller 165 may generate circuit activation signals based on a duty cycle (e.g., a power phase) of each of the power phase drivers 140. For example, the driver circuit 145 of a power stage may supply an output current (Iout) based on Vout when the phase control signal activates the corresponding power stage. In some examples, Iout may vary between the power phase drivers 140, causing a load imbalance between the power phase drivers 140. For example, the load imbalance may cause overloading and/or overheating of some components in the power phase drivers 140. In some examples, the imbalance may negatively affect efficiency and/or performance of the power supply circuit 110.

For example, the MPSCSC 170 may receive output current information from each of the power phase drivers 140 using a dual mode current sampling circuit (DMCSC 180). As shown, the MPSCSC 170 may be coupled to the low side driver 160 of each of the power phase drivers 140 to generate a balance measurement signal of the power phase drivers 140 (Ibal1, . . . , Ibaln). For example, the DMCSC 180 may be activated by the low side switch signal of each power stage to generate the measurement signal related to a relative output current of the power stage. In some implementations, the DMCSC 180 may generate the measurement signal from a power ground reference. For example, using the DMCSC 180, the MPPCC 135 may advantageously reduce size requirements of a ground plate.

In some implementations, the DMCSC 180 may be operated in two modes, a data collection mode and a sensing mode. In the data collection mode, for example, the controller 175 may receive no information from the DMCSC 180. The controller 175 may be switched to a sensing mode to receive phase current information relative to other power stages. For example, the sensing mode may be activated when the corresponding power phase driver may be in an off state in the duty cycle (e.g., when the low side driver 160). For example, the DMCSC 180 may include a direct current resistance low side drain-source on resistance sensing circuit to generate the balance measurement signal in the sensing mode.

The controller 175 includes a noise canceling engine 185, a phase compensation engine 190, and a current regulation engine 195. As shown, with n power stages, the controller 175 receives the current balance signals at inputs Ibal1, . . . , Ibaln. The controller 175 also receives a current sensing signal Isenn. In some implementations, the Isenn signal may be used to mitigate noises of the current balance signal. For example, the noise canceling engine 185 may use the Isenn signal to mitigate noise generated by parasitic resistance in the MPSCSC 170. In some implementations, the controller may be configured to use the Isenn signal to compensate for gain errors in all n power stages.

The controller 175 may determine a current imbalance based on the current balance signals. The phase compensation engine 190, in some implementations, may generate a relative balancing profile of the power phase drivers 140. For example, the controller 175 may determine that any of the power phase drivers 140 may be overloading based on the relative balancing profile. In some implementations, the controller 175 may generate a signal to mitigate an imbalanced output. As shown, the controller 175 may be operably coupled to the PWM controller 165. For example, the controller 175 may generate a feedback signal to the PWM controller 165 to regulate the Power phase drivers 140 of each power phase.

For example, when a power stage k may be determined to be overloaded, the controller 175 may generate the feedback signal to reduce the phase output current at the power stage k by, for example, reducing a duty cycle of the power stage k. Accordingly, for example, the controller 175 may advantageously use the measurement signals to avoid fault development and protect the MPPCC 135.

In some implementations, the current regulation engine 195 may regulate the Iout of the power phase drivers 140. For example, the current regulation engine 195 may measure, based on a current measurement of Iout (e.g., using a current sensing circuit (not shown) implemented in the MPSCSC 170), an output power supplied to the load domain 115. For example, when the voltage and/or current may be higher than a threshold, the current regulation engine 195 may generate a signal to the PWM controller 165 to reduce power output at each phase.

In various implementations, a power control circuit (e.g., the MPPCC 135) may include at least two power phase drivers (e.g., the power phase drivers 140) configured to deliver power in at least two power phases. For example, each of the at least two power phase drivers may generate an output current at a driver circuit (e.g., the driver circuit 145). In some implementations, the power control circuit may include a controller configured to generate a control signal based on a relative load balance between the at least two power phase drivers. For example, the controller may receive, for each power phase, a current balancing input. For example, the current balancing input may be generated by a dual mode current sensing circuit (e.g., the DMCSC 180). The DMCSC, for example, may generate the current balance inputs based on a direct current resistance (DCR) current sensing circuit. In some implementations, in a data collection mode, the DMCSC may store information of the output current of the corresponding at least two power phase drivers. In a sensing mode, for example, the DMCSC may generate a current balancing input in relation to the output current based on the DCR current sensing circuit and an active resistance in the low side driver circuit. Upon receiving the current balancing inputs, the controller may compensate for relative gains of the current balancing inputs based on the sense compensation input. Based on the compensated current balance inputs, the controller may determine a load imbalance in the power phases.

Figure 2:
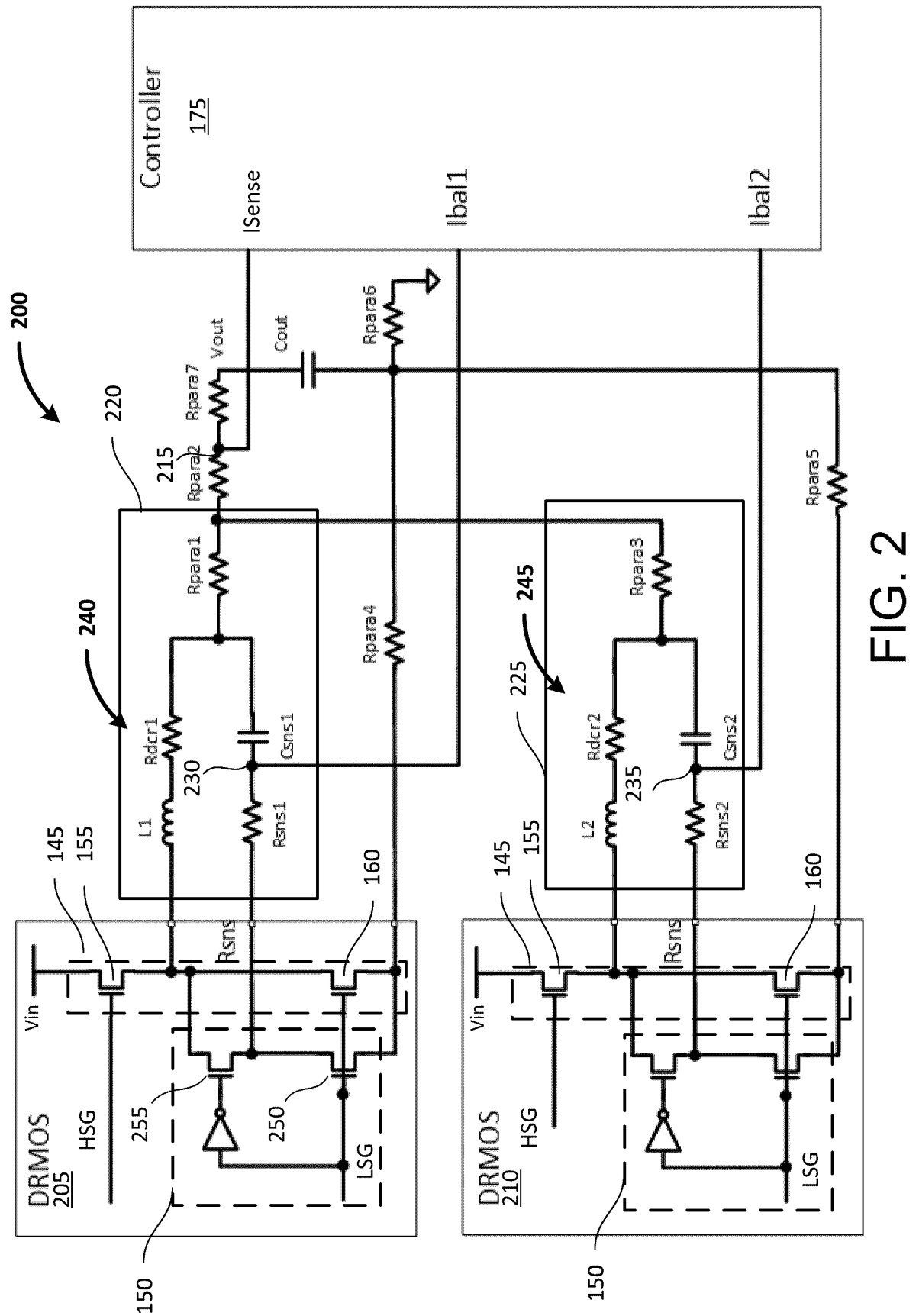
FIG. 2 depicts an exemplary dual mode current sampling circuit (DMCSC) in an exemplary MPSCSC as described with reference to FIG. 1.

FIG. 2 depicts an exemplary DMCSC in a multi-phase power control circuit (e.g., the MPPCC 135). In this example, an MPPCC 200 includes a phase 1 DRMOS (DRMOS 205) and a phase 2 DRMOS (DRMOS 210). For example, one of the power phase drivers 140 may include the DRMOS 205. For example, one of the power phase drivers 140 may include the DRMOS 210. In some implementations, the DRMOS 205 and the DRMOS 210 may each include the driver circuit 145 and the sense FET circuit 150 in a single package. In this example, the sense FET circuit 150 includes a low side sense MOSFET 250 and a high side sense MOSFET 255.

For example, the power phase drivers 140 may receive control signals from the PWM controller 165. In some implementations, the PWM controller 165 may control a duty cycle of the DRMOS 205 and the DRMOS 210. For example, during the duty cycle of the DRMOS 205, the high side gate (HSG) of DRMOS 205 (phase 1) may be switched on and the low side gate (LSG) of DRMOS 205 may be switched off. For example, during the duty cycle of the DRMOS 210, the HSG of the DRMOS 210 may be switched on and the LSG of the DRMOS 210 may be switched off.

In this example, the controller 175 receives a sensed current (Isenn) of the MPPCC 200 at a node 215. In various implementations, a measurement of Isenn at the node 215 may advantageously mitigate errors generated by a parasitic resistor Rpara7.

The MPPCC 200 includes a DMCSC 220 connected to the DRMOS 205, and a DMCSC 225 connected to the DRMOS 210. For example, the DMCSC 220 may generate a balance current signal of the DRMOS 205 at a node 230. For example, the DMCSC 225 may generate a balance current signal of the DRMOS 210 at a node 235.

In this example, the DMCSC 220 includes a DCR current sensing circuit 240, and the DMCSC 225 includes a DCR current sensing circuit 245. The DCR current sensing circuit 240 and the DCR current sensing circuit 245, as shown, each include a DCR inductor (L1 and L2), a DCR resistor (Rdcr1 and Rdcr2), and a sensing capacitor (Csns1 and Csns2). In various implementations, L1 and L2 may be low cost inductors. For example, the DCR of L1 and L2 may be very low. For example, L1 and L2 may not match with each other (and to other phases in the MPPCC 200).

The controller 175 receives the balance current signal of the DRMOS 205 (Ibal1) at the node 230, and a balance current signal of the DRMOS 210 (Ibal2) at the node 235. In some implementations, as an illustrative example focusing on phase 1 (the DRMOS 205), the DMCSC 220 may operate in two modes. In a data collection mode, a voltage may be developed across Csns1. For example, when the HSG may be on, the DMCSC 220 may operate in the data collection mode. For example, a voltage across Csns1 may correspond to a voltage across a DC resistance (Rdcr) of an output inductor L1.

When the HSG may be off and the LSG may be on, for example, the DMCSC 220 may be operating in a sensing mode. For example, the Csns1 may be discharged through a power ground (PGND). For example, the controller 175 may measure the response at Ibal1 to determine a phase current of the DRMOS 205 relative to a phase current of the DRMOS 210. For example, the controller 175 may determine that the DRMOS 205 may be overloaded. For example, the controller 175 may generate a signal to the PWM controller 165 to reduce current output at the DRMOS 205 based on the DRMOS 205 being overloaded.

In some implementations, the balance current signal at Ibal1 may be generated as function of the Rdcr (e.g., Rdcr1), a drain-source on resistance of the low side transistor 160, and a duty cycle of the power stage (e.g., the DRMOS 205). For example, the balance current signal (e.g., a voltage across Csns1) received at the Ibal1 in the sensing mode may be given by $V=I_{L1}(Rdcr+(1-D)Rds\_on)$. Accordingly, for example, an accuracy of the balance current signal may be advantageously independent of a sense resistor (Rsns1), and parasitic resistors (Rpara4, and Rpara6).

In some implementations, the noise canceling engine 185 may include digital gain compensation to reduce gain error generated by Rpara1 and Rpara3. For example, the digital control may include a static gain compensation to correct the gain error. For example, the digital gain compensation may include dynamic gain control based on Isenn, Ibal1, and Ibal2.

In some implementations, the MPPCC 200 may include a board layout design that advantageously reduces resistance of Rpara2. For example, by keeping the resistance of Rpara2 low, cross phase gain errors introduced by other phases (e.g., signal from DRMOS 210 introduced to Ibal1) may advantageously be reduced.

In some implementations, the DMCSC 220, 225 may provide relative current balance information to the controller 175 without requiring the driver circuit 145 to connect to Vin. Accordingly, for example, protection circuitry used to protect the driver circuit 145 for a connection to the Vin may advantageously be removed.

Figure 3:
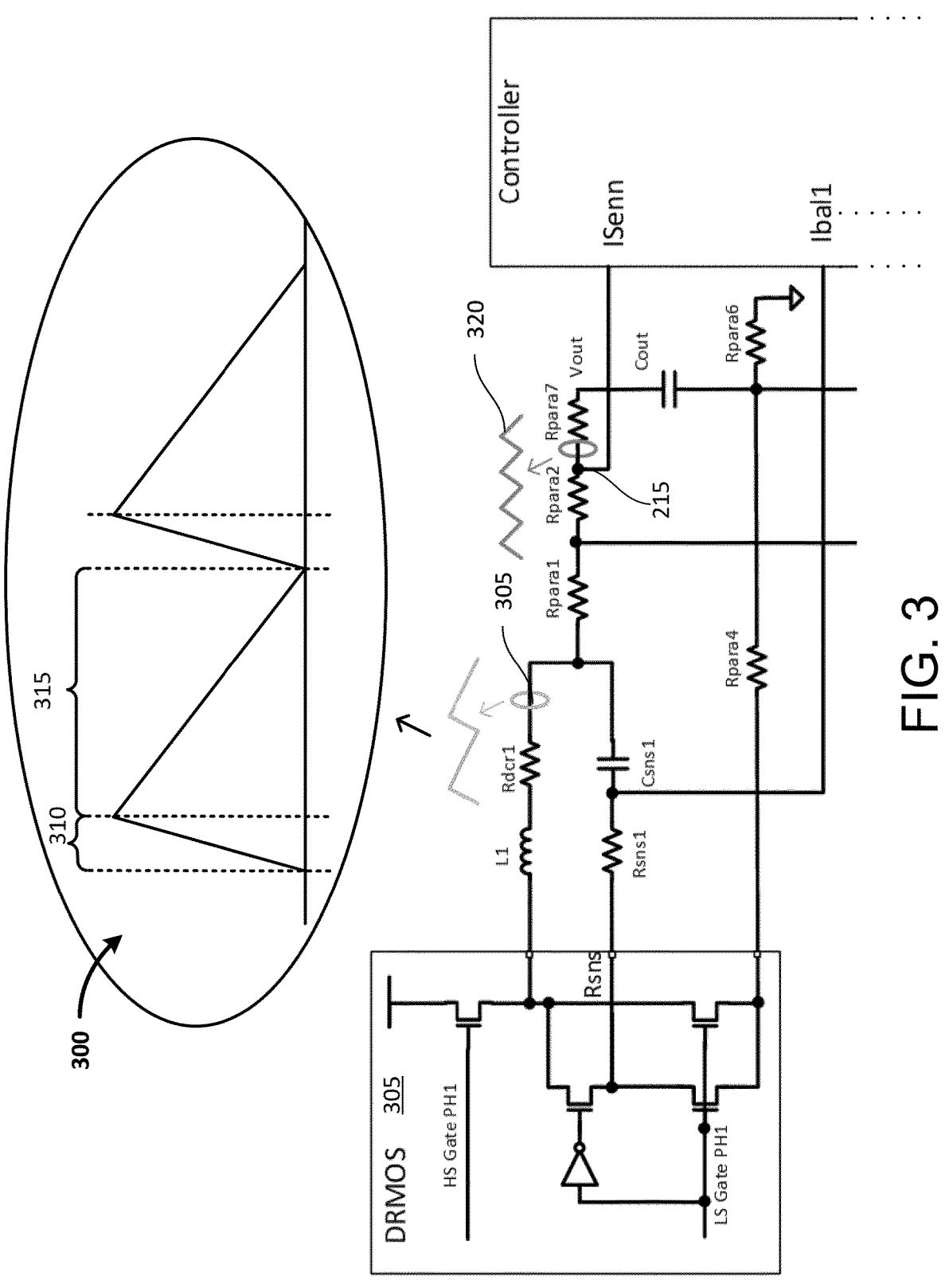
FIG. 3 depicts exemplary sensing responses of an exemplary DMCSC.

FIG. 3 depicts exemplary sensing responses at various nodes in an exemplary DMCSC. In this example, an exemplary response 300 at a node 305 of the DRMOS 205 and the DMCSC 220 (as described in FIG. 2) may be shown. As shown, the voltage across Csns1 may increase in a data collection mode 310. The voltage may, for example, be discharged during a sensing mode 315. In various implementations, a duration of the data collection mode 310 may be significantly shorter than a duration of the data collection mode 310. For example, in a 24 phase power supply circuit, the duration of the node 305 to the duration of the sensing mode 315 may be 1:23. Accordingly, the DMCSC 220 may advantageously measure a substantial portion of a duty cycle of the DRMOS 205 while maintaining no connection between the driver circuit 145 to the Vin.

In this example, an exemplary response 320 at the node 215 may be also shown. For example, the exemplary response 320 may be an aggregate response of the power phase drivers 140. In various implementations, the controller 175 may use the exemplary response 320 to compensate gain errors in the current balancing inputs (Ibal) in each of the power phase drivers 140.

Figure 4:
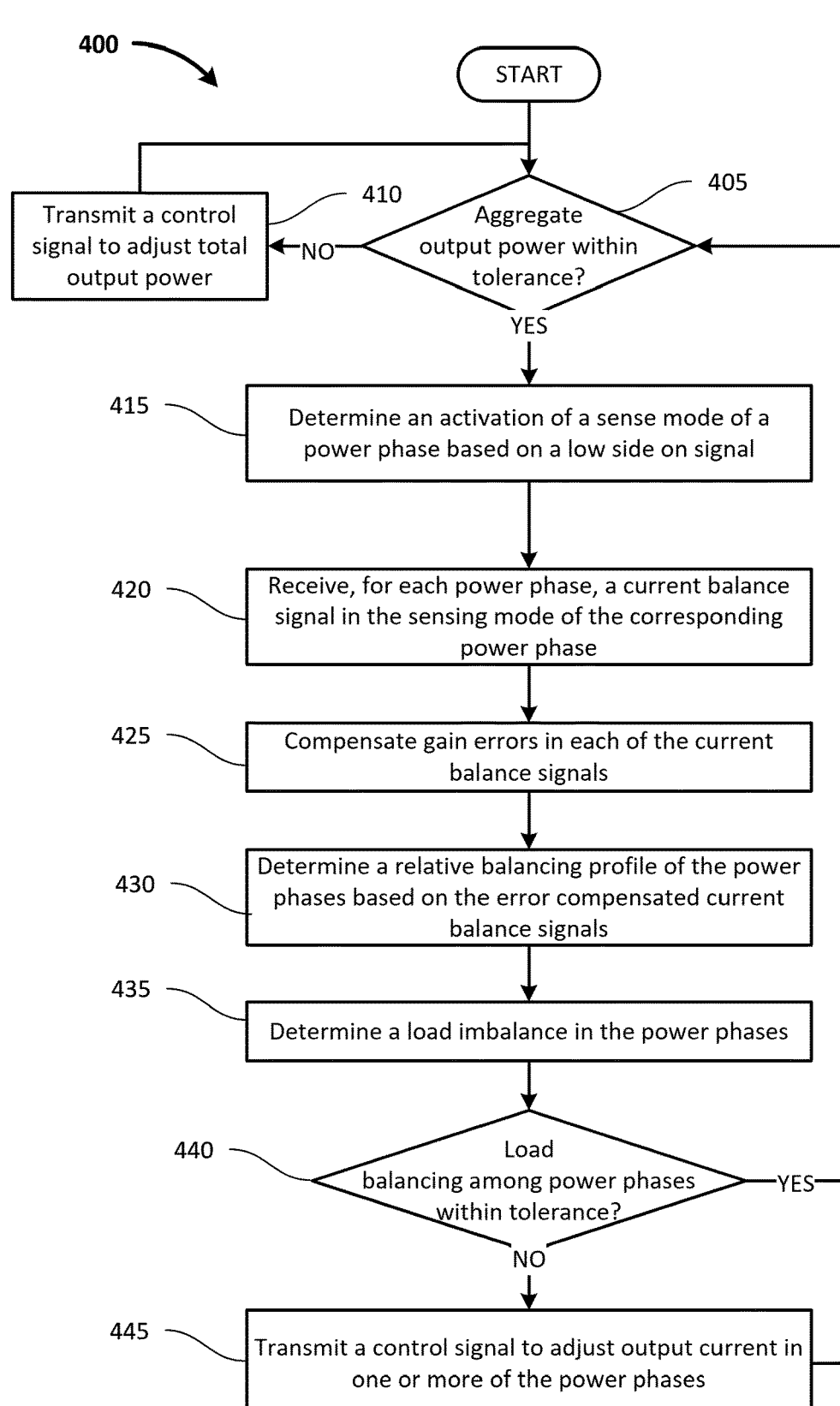
FIG. 4 may be a flowchart illustrating an exemplary current balancing method.

FIG. 4 may be a flowchart illustrating an exemplary current balancing method 400. For example, the controller 175 may perform the exemplary current balancing method 400 using the noise canceling engine 185, the phase compensation engine 190, and/or the current regulation engine 195 to regulate and control an aggregate current and independent phase output current of a multi-phase power supply (e.g., the power supply circuit 110).

The method 400 begins at a decision point 405 when it may be determined whether an aggregate output power of the power supply may be within tolerance. For example, the controller 175 may compare the aggregate output current and output voltage with a predetermined threshold. If the aggregate output power of the power supply may be not within tolerance, in step 410, a control signal may be transmitted to adjust total output power. For example, the controller 175 may transmit a control signal to the PWM controller 165 to reduce power output.

If the aggregate output power of the power supply may be within tolerance, an activation of a sense mode of a power phase may be determined based on a low side on signal in step 415. For example, the controller 175 may receive a voltage drop when the DRMOS 205 may be in the sensing mode. In step 420, a current balance signal may be received for each power phase in the sensing mode of the corresponding power phase. For example, the controller 175 may receive, for each of the power phase drivers 140, a voltage across the Csns as shown in the sensing mode 315 of the exemplary response 300 as described with reference to FIG. 3.

Next, gains errors may be compensated in each of the current balance signals in step 425. For example, the controller 175 may use the noise canceling engine 185 to compensate the received current balance signals. For example, the controller 175 may compensate the received current balance signals based on the Isenn. In step 430, a relative balancing profile of the power phases may be determined based on the error compensated current balance signals. Next, in step 435, a load imbalance in the power phases may be determined. For example, the controller 175 may determine that any of the power phase drivers 140 may be generating overcurrent.

In a decision point 440, it may be determined whether a load balancing among power phases may be within tolerance. For example, the controller 175 may include an imbalance tolerance that the output current of each phase to be within (a maximum of) 5% of each other. If the load balancing among power phases may be within tolerance, the decision point 405 may be repeated. If load balancing among power phases may be not within tolerance, in step 445, a control signal to adjust output current in one or more of the power phases may be transmitted, and the decision point 405 may be repeated. For example, the controller 175 may transmit a signal to the PWM controller 165 to reduce a duty cycle of an overcurrent power phase driver to reduce the load of the power phase driver so that the power phase driver may advantageously be protected.

Although various embodiments have been described with reference to the figures, other embodiments may be possible.

In some implementations, the high side driver 155 (and/or the low side driver 160) may also include other transistors. For example, the high side driver 155 may include a bipolar junction transistors (BJT). For example, the high side driver 155 may include insulated gate bipolar transistor (IGBT). For example, the high side driver 155 may include a gallium nitride transistor. For example, the high side driver 155 may include a junction field-effect transistor (JFET).

Although an exemplary system has been described with reference to FIG. 1, other implementations may be deployed in other industrial, scientific, medical, commercial, and/or residential applications. For example, the power supply circuit 110 having the MPPCC 135 may be used in generative artificial intelligence computing application (e.g., for a Chat Generative Pre-trained Transformer (ChatGPT)). For example, the power supply circuit 110 having the MPPCC 135 may be used in crypto mining applications. For example, the power supply circuit 110 having the MPPCC 135 may be used in a high performance gaming system.

In various embodiments, some bypass circuits implementations may be controlled in response to signals from analog or digital components, which may be discrete, integrated, or a combination of each. Some embodiments may include programmed, programmable devices, or some combination thereof (e.g., PLAs, PLDs, ASICs, microcontroller, microprocessor), and may include one or more data stores (e.g., cell, register, block, page) that provide single or multi-level digital data storage capability, and which may be volatile, non-volatile, or some combination thereof. Some control functions may be implemented in hardware, software, firmware, or a combination of any of them.

Computer program products may contain a set of instructions that, when executed by a processor device, cause the processor to perform prescribed functions. These functions may be performed in conjunction with controlled devices in operable communication with the processor. Computer program products, which may include software, may be stored in a data store tangibly embedded on a storage medium, such as an electronic, magnetic, or rotating storage device, and may be fixed or removable (e.g., hard disk, floppy disk, thumb drive, CD, DVD).

Some systems may be implemented as a computer system that can be used with various implementations. For example, various implementations may include digital circuitry, analog circuitry, computer hardware, firmware, software, or combinations thereof. Apparatus can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Various embodiments can be implemented advantageously in one or more computer programs that may be executable on a programmable system including at least one programmable processor coupled to receive data and instructions from, and to transmit data and instructions to, a data storage system, at least one input device, and/or at least one output device. A computer program may be a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, which may include a single processor or one of multiple processors of any kind of computer. Generally, a processor will receive instructions and data from a read-only memory or a random-access memory or both. The essential elements of a computer may be a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and CD-ROM and DVD-ROM disks. The processor and the memory can be supplemented by, or incorporated in, ASICs (application-specific integrated circuits).

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

Various examples of modules may be implemented using circuitry, including various electronic hardware. By way of example and not limitation, the hardware may include transistors, resistors, capacitors, switches, integrated circuits, other modules, or some combination thereof. In various examples, the modules may include analog logic, digital logic, discrete components, traces and/or memory circuits fabricated on a silicon substrate including various integrated circuits (e.g., FPGAs, ASICs), or some combination thereof. In some embodiments, the module(s) may involve execution of preprogrammed instructions, software executed by a processor, or some combination thereof. For example, various modules may involve both hardware and software.

In an illustrative aspect, A multi-phase power supply system may include a plurality of power phase drivers configured to deliver power in a plurality of power phases. For example, each of the plurality of power phase drivers may include a high side transistor having a drain connected to a power input and a source connected to a power output of a corresponding power phase driver, a low side transistor having a drain connected to the power output, and a sense FET circuit may include a high side sense FET and a low side sense FET. For example, a drain of the high side sense FET connected to the power output, a source of high side sense FET connected to a drain of the low side sense FET, and a source of the low side sense FET connected to a source of the low side transistor.

For example, the high side transistor, the low side transistor, and the sense FET circuit may be integrated in a single package. For example, each of the plurality of power phase drivers may include an overcurrent protection circuit such that the high side transistor, the low side transistor, the sense FET circuit, and the overcurrent protection circuit may be integrated in a single package.

For example, each of the plurality of power phase drivers may include a package outline of 5 mm×5 mm.

The multi-phase power supply system may include, for example, a controller configured to generate a control signal based on a relative load balance between the plurality of power phase drivers. For example, the controller may include a plurality of current balancing inputs, each corresponding to one of the power phases. For example, the controller may include a sense compensation input coupled to an output of the plurality of power phase drivers. the controller may include a dual mode current sensing circuit coupled to the plurality of power phase drivers and the controller. For example, the dual mode current sensing circuit may include, for each of the plurality of power phases, a direct current resistance (DCR) current sensing circuit, and the dual mode current sensing circuit may be configured, for example, in a data collection mode, the dual mode current sensing circuit stores information of an output current of the corresponding power phase. For example, in a sensing mode, the dual mode current sensing circuit generates a current balancing input as a function of a direct current resistance (Rdcr) of the DCR current sensing circuit and a low side drain-source on resistance of the low side transistor.

For example, upon receiving the current balancing inputs, the controller may be configured to compensate relative gains of the current balancing inputs based on the sense compensation input. For example, the controller may determine a load imbalance in the plurality of power phases. For example, the controller may generate a load balancing signal to balance the load imbalance in one of the plurality of phase power drivers.

For example, the controller further may include a digital gain compensation module configured to reduce gain error in the plurality of current balancing inputs. For example, the controller may be configured to maintain a difference between the load current of the plurality of power phase drivers at a maximum of 5%. For example, the controller may include a current regulation engine configured to regulate a total current output of the plurality of phase power drivers, such that an overcurrent of the multi-phase power supply may be prevented.

The multi-phase power supply system, for example, may include a plurality of dual mode current sensing circuits each including a direct current resistance (DCR) current sensing circuit having a direct current resistor with a first end connected to an output end of an inductor and a sense resistor connected in series with a sense capacitor between the source the high side sense FET and a second end of the direct current resistor.

In an illustrative aspect, a multi-phase power supply system may include at least two power phase drivers configured to deliver power in at least two power phases. For example, each of the at least two power phase drivers generate an output current by a high side driver circuit and a low side driver circuit. For example, the multi-phase power supply system may include a controller configured to generate a control signal based on a relative load balance between the at least two power phase drivers. For example, the controller may include a plurality of current balancing inputs, each corresponding to one of the power phases. For example, the controller may include sense compensation input coupled to an output of the at least two power phase drivers. For example, the controller may include a dual mode current sensing circuit coupled to the at least two power phase drivers and the controller. For example, the dual mode current sensing circuit may include, for each of the at least two power phases, a direct current resistance (DCR) current sensing circuit configured to generate the plurality of current balancing inputs for the at least two power phase drivers.

For example, in a data collection mode, the dual mode current sensing circuit stores information of the output current of the corresponding at least two power phase drivers. For example, in a sensing mode, the dual mode current sensing circuit generates a current balancing input in relation to the output current based on the DCR current sensing circuit and an active resistance in the low side driver circuit. For example, upon receiving the current balancing inputs, the controller may be configured to compensate relative gains of the current balancing inputs of the plurality of the power phases based on the sense compensation input. For example, based on the compensated current balance inputs, the controller may determine a load imbalance in the at least two power phases.

For example, the plurality of current balancing inputs may be measured relative to power ground. For example, the at least two power phase drivers may include at least six power phase drivers. For example, each of the at least two power phase drivers may include a high side transistor, a low side transistor, and a sense FET circuit. For example, the sense FET circuit may include a high side sense FET and a low side sense FET. For example, the current balancing input of each power phase may be generated as a function of a direct current resistance (Rdcr) and a drain-source on resistance of the low side transistor.

For example, the controller may be configured to maintain a difference between the load current of the at least two power phase drivers at a maximum of 5%. For example, the controller may include a digital gain compensation module configured to reduce gain error in the current balancing inputs. For example, the controller may be configured to generate a load balancing signal to balance an overload in one of the at least two power phase drivers.

For example, the controller may include a current regulation engine configured to regulate a total current output of the at least two power phase drivers, such that an overcurrent of the multi-phase power supply system may be prevented.

In an illustrative aspect, a power regulation method in a multi-phase power control circuit may include, in a data collection mode, allow a current sensing circuit to collect data associated with an output current of a power phase. For example, the power phase may be one of a plurality of power phases in a power supply circuit. For example, the power regulation method may include determining a transition from the data collection mode to a sensing mode of the power phase associated with a low side on signal. For example, the power regulation method may include receiving, for each power phase, a current balance signal in the sensing mode. For example, the current balance signal may be generated based on a direct current resistance (Rdcr) of the current sensing circuit of the power phase and a drain-source on resistance of a low side transistor of a corresponding power phase.

For example, the power regulation method may include compensating gain errors in each power phase as a function of the current balance signal of a corresponding power phase. For example, the power regulation method may include determining a load imbalance in the plurality of power phases. For example, the power regulation method may include transmitting a control signal to adjust the output current of each of the plurality of power phases.

For example, the control signal may include an instruction to reduce a duty cycle of an overcurrent power phase. For example, the plurality of power phases may include at least six phases.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations may be contemplated within the scope of the following claims.

What is claimed is:

1. A multi-phase power supply system comprising:
a plurality of power phase drivers configured to deliver power in a plurality of power phases, wherein each of the plurality of power phase drivers comprise:
a high side transistor having a drain connected to a power input and a source connected to a power output of a corresponding power phase driver;
a low side transistor having a drain connected to the power output; and,
a sense FET circuit comprising a high side sense FET and a low side sense FET, wherein a drain of the high side sense FET connected to the power output, a source of the high side sense FET connected to a drain of the low side sense FET, and a source of the low side sense FET connected to a source of the low side transistor,
wherein the high side transistor, the low side transistor, and the sense FET circuit are integrated in a single package,
wherein each of the plurality of power phase drivers further comprise an overcurrent protection circuit such that the high side transistor, the low side transistor, the sense FET circuit, and the overcurrent protection circuit are integrated in a single package,
wherein each of the plurality of power phase drivers comprises a package outline of 5 mm×5 mm.

2. A multi-phase power supply system comprising:

a plurality of power phase drivers configured to deliver power in a plurality of power phases, wherein each of the plurality of power phase drivers comprise:

a high side transistor having a drain connected to a power input and a source connected to a power output of a corresponding power phase driver;

a low side transistor having a drain connected to the power output; and, a sense FET circuit comprising a high side sense FET and a low side sense FET, wherein a drain of the high side sense FET connected to the power output, a source of the high side sense FET connected to a drain of the low side sense FET, and a source of the low side sense FET connected to a source of the low side transistor, a controller configured to generate a control signal based on a relative load balance between the plurality of power phase drivers, wherein the controller comprises:

a plurality of current balancing inputs, each corresponding to one of the plurality of power phases; and, a sense compensation input coupled to an output of the plurality of power phase drivers; and, a dual mode current sensing circuit coupled to the plurality of power phase drivers and the controller, wherein the dual mode current sensing circuit comprises, for each of the plurality of power phases, a direct current resistance (DCR) current sensing circuit, and the dual mode current sensing circuit is configured such that, in a data collection mode, the dual mode current sensing circuit stores information of an output current of the corresponding power phase; and, in a sensing mode, the dual mode current sensing circuit generates a current balancing input as a function of a direct current resistance (Rdcr) of the DCR current sensing circuit and a drain-source on resistance of the low side transistor; and, upon receiving the plurality of current balancing inputs of the plurality of power phases, the controller is configured to:

compensate relative gains of the current balancing inputs based on the sense compensation input, determine a load imbalance in the plurality of power phases, and, generate a load balancing signal to balance the load imbalance in one of the plurality of power phase drivers.

3. The multi-phase power supply system of claim 2, wherein the controller further comprising:

a digital gain compensation module configured to reduce gain error in the plurality of current balancing inputs.

4. The multi-phase power supply system of claim 2, wherein the controller is configured to maintain a difference between load currents of the plurality of power phase drivers at a maximum of 5%.

5. The multi-phase power supply system of claim 2, wherein the controller further comprises a current regulation engine configured to regulate a total current output of the plurality of power phase drivers, such that an overcurrent of the multi-phase power system is prevented.

6. A multi-phase power supply system comprising:

at least two power phase drivers configured to deliver power in at least two power phases, wherein each of the at least two power phase drivers generate an output current by a high side driver circuit and a low side driver circuit;

a controller configured to generate a control signal based on a relative load balance between the at least two power phase drivers, wherein the controller comprises:

a plurality of current balancing inputs, each corresponding to one of the at least two power phases; and, a sense compensation input coupled to an output of the at least two power phase drivers; and, a dual mode current sensing circuit coupled to the at least two power phase drivers and the controller, wherein the dual mode current sensing circuit comprises, for each of the at least two power phases, a direct current resistance (DCR) current sensing circuit configured to generate the plurality of current balancing inputs for the at least two power phase drivers, wherein:

in a data collection mode, the dual mode current sensing circuit stores information of the output current of the corresponding at least two power phase drivers, and, in a sensing mode, the dual mode current sensing circuit generates a current balancing input in relation to the output current based on the DCR current sensing circuit and an active resistance in the low side driver circuit, such that upon receiving the current balancing inputs, the controller is configured to:

compensate relative gains of the current balancing inputs of the at least two power phases based on the sense compensation input, and, based on the compensated current balance inputs, determine a load imbalance in the at least two power phases.

7. The multi-phase power supply system of claim 6, wherein the plurality of current balancing inputs are measured relative to power ground.

8. The multi-phase power supply system of claim 6, wherein the at least two power phase drivers comprise at least six power phase drivers.

9. The multi-phase power supply system of claim 6, wherein each of the at least two power phase drivers comprise:

a high side transistor;

a low side transistor; and, a sense FET circuit comprising a high side sense FET and a low side sense FET, wherein the current balancing input of each power phase is generated as a function of a direct current resistance (Rdcr) and a drain-source on resistance of the low side transistor.

10. The multi-phase power supply system of claim 6, wherein the controller is configured to maintain a difference between load currents of the at least two power phase drivers at a maximum of 5%.

11. The multi-phase power supply system of claim 6, wherein the controller further comprises a digital gain compensation module configured to reduce gain error in the current balancing inputs of each of the at least two power phases.

12. The multi-phase power supply system of claim 6, wherein the controller is configured to generate a load balancing signal to balance an overload in one of the at least two power phase drivers.

13. The multi-phase power supply system of claim 6, wherein the controller further comprises a current regulation engine configured to regulate a total current output of the at least two power phase drivers, such that an overcurrent of the multi-phase power supply system is prevented.

14. A power regulation method in a multi-phase power control circuit, comprising:

in a data collection mode, allow a current sensing circuit to collect data associated with an output current of a power phase, wherein the power phase is one of a plurality of power phases in a power supply circuit;

determine a transition from the data collection mode to a sensing mode of the power phase associated with a low side on signal;

receive, for each power phase, a current balance signal in the sensing mode, wherein the current balance signal is generated based on a direct current resistance (Rdcr) of the current sensing circuit of the power phase and a drain-source on resistance of a low side transistor of a corresponding power phase;

compensate gain errors in each power phase as a function of the current balance signal of a corresponding power phase;

determine a load imbalance in the plurality of power phases; and, transmit a control signal to adjust the output current of each of the plurality of power phases.

15. The power regulation method of claim 14, wherein the control signal comprises an instruction to reduce a duty cycle of an overcurrent power phase.

16. The power regulation method of claim 14, wherein the plurality of power phases comprise at least six phases.

* * * * *